(12) United States Patent
Fitch et al.

(10) Patent No.: US 11,435,410 B1
(45) Date of Patent: Sep. 6, 2022

(54) SYSTEM AND METHOD FOR DETECTING METAL MIGRATION IN TWO-PHASE IMMERSION COOLING SYSTEMS

(71) Applicant: Dell Products L.P., Round Rock, TX (US)

(72) Inventors: Jon Taylor Fitch, Austin, TX (US); Steven Embleton, Austin, TX (US); David Lyle Moss, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 85 days.

(21) Appl. No.: 17/184,004

(22) Filed: Feb. 24, 2021

(51) Int. Cl.
*G01R 31/52* (2020.01)
*H05K 1/02* (2006.01)
*H05K 7/20* (2006.01)

(52) U.S. Cl.
CPC .......... *G01R 31/52* (2020.01); *H05K 1/0212* (2013.01); *H05K 7/20236* (2013.01); *H05K 2201/10151* (2013.01)

(58) Field of Classification Search
CPC .. G01R 31/52; H05K 1/0212; H05K 7/20236; H05K 2201/10151
USPC ........................................................ 324/157
See application file for complete search history.

(56) References Cited

U.S. PATENT DOCUMENTS

| | | |
|---|---|---|
| 7,362,448 B1 | 4/2008 | Liu et al. |
| 9,921,622 B2 * | 3/2018 | Shelnutt ............. H05K 7/20818 |
| 2007/0259256 A1 | 11/2007 | Le Canut et al. |
| 2009/0260777 A1 | 10/2009 | Attlesey |
| 2018/0288906 A1 | 10/2018 | Hopton et al. |
| 2020/0001513 A1 | 1/2020 | Jones et al. |
| 2020/0093026 A1 | 3/2020 | Enright et al. |
| 2021/0102294 A1 | 4/2021 | Miljkovic et al. |
| 2021/0219455 A1 | 7/2021 | Lau |

FOREIGN PATENT DOCUMENTS

| | | |
|---|---|---|
| JP | 2003247812 | 9/2003 |
| KR | 2014/0140039 | 12/2014 |
| WO | 9915881 | 4/1999 |

(Continued)

OTHER PUBLICATIONS

Flinn, Jason, and Mahadev Satyanarayanan. "Energy-aware adaptation for mobile applications." ACM SIGOPS Operating Systems Review 33.5 (1999): 48-63.

(Continued)

*Primary Examiner* — Farhana A Hoque
(74) *Attorney, Agent, or Firm* — Baker Botts L.L.P.

(57) ABSTRACT

A system for detecting contamination in a two-phase immersion cooling system based on current leakage between two combs on a printed circuit board. A first comb is opposite a second comb, wherein each finger of the first comb is positioned between two adjacent fingers on the second comb. The combs are positioned near a heat source in the liquid portion of the fluid. As the fluid boils, contaminants are distilled out of the fluid. Acidic contaminants deposited on either comb may cause metal migration to occur, resulting in bridging between two combs. A current sensor may detect the current leakage and send a signal to allow the information handling system, the fluid, or the cooling system to be serviced before damage occurs to the information handling system.

20 Claims, 5 Drawing Sheets

(56) References Cited

FOREIGN PATENT DOCUMENTS

WO  2009/022649  11/2010
WO  2015/074669   5/2015

OTHER PUBLICATIONS

Aguilar-Saborit, Josep, et al. "Dynamic adaptive data structures for monitoring data streams." Data & Knowledge Engineering 66.1 (2008): 92-115.
Masanet, Eric, et al. "Recalibrating global data center energy-use estimates." Science 367.6481 (2020): 984-986.
QTS, "Green Data Centers—Scaling environmental sustainability for business and oncsumers collectively." htttps://www.networkworld.com/article/3569189/green-data-centers-scaling-environmental-sustainability-for-business-and-consumers-collectively.html, Jul. 30, 2020.
P. E. Tuma, "Design considerations relating to non-thermal aspects of passive 2-phase immersion cooling," *2011 27th Annual IEEE Semiconductor Thermal Measurement and Management Symposium*, San Jose, CA, 2011, pp. 1-9.
H. Coles, M. Herrlin, Immersion Cooling of Electronics in DoD Installations, Ernest Orlando Berkeley National Laboratory Report LBNL-100566, May 2016.
Husam Alissa, Mark Shaw, Liquid Immersion Optimized Servers, Presentation at Open Compute Forum San Jose CA Mar. 3-4, 2020.

\* cited by examiner

SYSTEM AND METHOD FOR DETECTING METAL MIGRATION IN TWO-PHASE IMMERSION COOLING SYSTEMS

BACKGROUND

Field of the Disclosure

This disclosure relates generally to immersion cooling and, more particularly, to systems for detecting metal migration in two-phase immersion cooling systems for information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be generally directed to detecting metal migration on components to identify residue in two-phase immersion cooling systems used for cooling information handling systems.

Some immersion cooling systems use two-phase fluids to directly remove heat from components. Heat causes the two-phase fluid to change from a first phase (the liquid phase) to a second phase (the vapor phase), wherein the boiling point of the fluid is selected to maintain a component temperature at or below a threshold temperature. In some systems, component surfaces may be etched, have a boiling enhancement coating (BEC) or otherwise be configured to have increased surface area for improved heat transfer to the two-phase fluid.

Embodiments disclosed herein may be directed to systems for detecting metal migration caused by the presence of contaminants in two-phase immersion cooling systems. A system for detecting metal migration in an information handling system immersed in a two-phase fluid in a tank comprises a printed circuit board (PCB) with a pair of combs with each comb having a plurality of fingers, a voltage source coupled to the first comb and a current sensor coupled to the second comb. The fingers of the first comb are positioned between adjacent fingers of the second comb. The voltage source connected to the first comb applies a voltage to the first comb and the current sensor is configured to detect current leakage from the first comb to the second comb and output a signal based on the current leakage. A processor is coupled to the current sensor and is configured to receive the signal from the current sensor, determine the current leakage based on the signal and communicate an indication that contaminants are present in the two-phase fluid based on the current leakage.

Each finger in the first plurality of fingers and the second plurality of fingers comprises a trace formed from a first material and a solder coating formed from a second material. In some embodiments, the trace comprises copper and the solder coating comprises an alloy with tin, lead and silver. The first plurality of fingers in the first comb and the second plurality of fingers in the second comb may be configured to represent a type of connection corresponding to a component in the information handling system. Each finger in the first plurality of fingers or second plurality of fingers may be configured with a width to corresponding to a diameter of a solder ball in a ball grid array (BGA). Each finger in the first plurality of fingers may be separated from a finger in the second plurality of fingers by a separation distance less than a separation distance between two traces, BGA solder balls or terminals associated with a component or a printed circuit board in an information handling system.

The system may be positioned near a component, wherein the component functions as a heat source to cause boiling of the fluid. In some embodiments, the system is coupled to a component and the pair of combs are positioned facing away from the component. In some embodiments, a spacer is positioned between the component and the current sensor, wherein the pair of combs are positioned at a distance from the component by the spacer and the pair of combs are facing away from the component. In some embodiments, a spacer is positioned between the component and the current sensor, wherein the pair of combs are positioned at a distance from the component by the spacer and the pair of combs are facing toward the component.

A heat source may be coupled to the PCB, wherein the heat source is configured to cause boiling of the fluid so the system may be positioned away from a component. The heat source may be configured to generate more heat than the component.

A system for detecting metal migration on an information handling system may be communicatively coupled to a service system external to the tank. The system may send an indication that contaminants are present to the service system. The indication may be a basic signal indicating current leakage is present or may provide more information including the current leakage detected and the comb structure used to detect the current leakage.

Embodiments disclosed herein may be directed to a method for detecting metal migration in an information handling system immersed in a two-phase fluid in a tank. The method may include applying a voltage to a first comb of a pair of combs on a printed circuit board (PCB) immersed in a two-phase fluid in a tank, detecting, in a second comb, a current leakage from the first comb to the second comb, determining metal migration is present based on the current leakage detected in the second comb; and sending a signal that contaminants are present in the two-phase fluid based on the current leakage. A first plurality of fingers in the first comb and a second plurality of fingers in the second comb may be configured to represent a type of connection corresponding to a component in the information handling system. Sending a signal that contaminants are present in the two-phase fluid based on the current leakage may comprise sending a signal to a service system external to the tank.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
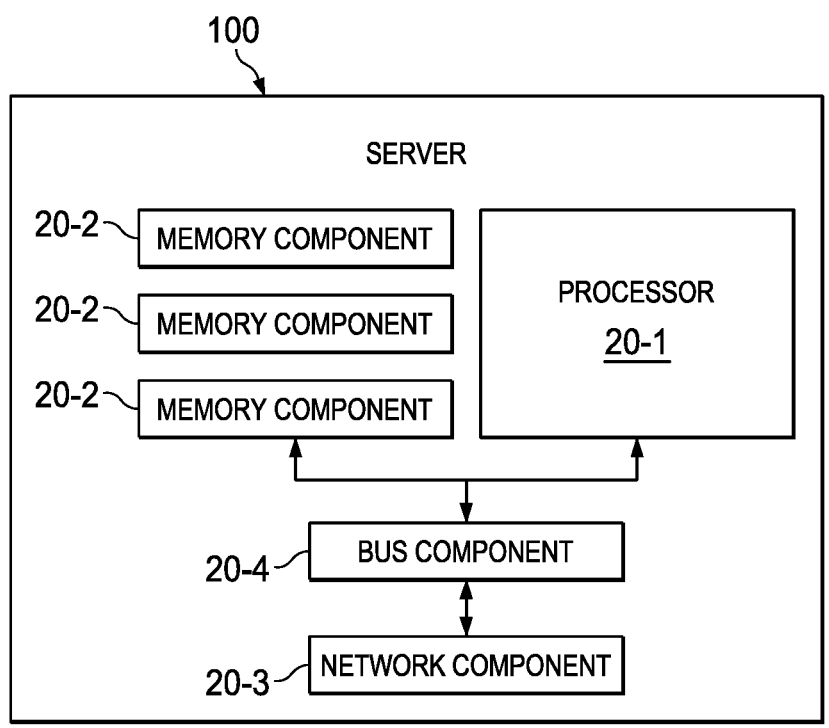
FIG. 1 is a block diagram of selected components of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, component "20-1" refers to an instance of a component, which may be referred to collectively as components "20" and any one of which may be referred to generically as component "20."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices and one or more communications ports for communicating with external devices. The information handling system may also include one or more buses operable to transmit communication between the various hardware components.

Embodiments disclosed herein are described with respect to cooling of heat-generating components on servers installed in tanks containing two-phase fluids. Particular embodiments are best understood by reference to FIGS. 1-6, wherein like numbers are used to indicate like and corresponding parts.

Referring to FIG. 1, an information handling system such as information handling system 100 may include processor components 20-1, memory components 20-2 and network components 20-3, along with bus components 20-4 or other systems for connecting components 20 on information handling system 100.

Referring to FIG. 1, an information handling system such as information handling system 100 may include processor components 20-1, memory components 20-2 and network components 20-3, along with bus components 20-4 or other systems for connecting components 20 on information handling system 100.

Processor components 20-1 may comprise systems, devices, or apparatuses operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor components 20-1 may interpret and execute program instructions and process data stored locally (e.g., in memory subsystem). In the same or alternative embodiments, processor components 20-1 may interpret and execute program instructions and process data stored remotely (e.g., in a network storage resource).

Memory components 20-2 may comprise systems, devices, or apparatuses operable to retain and retrieve program instructions and data for a period of time (e.g., computer-readable media). Memory components 20-2 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system is powered down.

Network components 20-3 may comprise systems, devices, or apparatuses operable to serve as an interface between an information handling system and a network (not shown). Network components 20-3 may enable information handling systems 100 to communicate over a network using a suitable transmission protocol or standard. In some embodiments, a network interface may be communicatively coupled via a network to a network storage resource (not shown). A network coupled to a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to a network interface or various network components 20-3 associated therewith may be implemented using hardware, software, or any combination thereof.

Bus components 20-4 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Components 20 receive power and communicate with other components 20 on information handling system 100 through electronic connections. As power and communication enters information handling system 100, the connections allow information handling system 100 to execute instructions and process information. Examples of electronic connections include permanent connections such as ball grid arrays (BGAs) and other soldered connections and non-permanent connections such as pin connectors, which allow for easier installation and removal of components 20. Each connection provides a path for power and/or communication between components 20 on information handling system 100. Each connection may involve one or more contact points. In some information handling systems, contact points may be formed at least partially with gold due to the low current resistance of gold and formed at least partially with nickel or some other material to protect the gold or provide a better base for adhering the gold to the component, PCB, etc. Information handling systems 100 can have 10,000 or more contact points including contact points found in Dual In-Line Memory Modules (DIMMs), peripheral component interface express (PCIe) cards, central processing units (CPUs) and other components.

Variations of information handling system 100 are possible. For example, FIG. 1 depicts network components 20-3 as part of information handling system 100 and processor component 20-1 may be the primary component 20 or subsystem being cooled. However, a two-phase immersion cooling system may be useful for cooling large telecom data center switches where the primary system being cooled is a network switch 20-3. Other systems may be a data storage center where the primary system being cooled is a memory component 20-2.

Two-Phase Immersion Cooling System

As components 20 on information handling system 100 execute instructions and process information, they generate heat. One approach to cool components 20 is a two-phase immersion cooling system. In two-phase immersion cooling, one or more information handling systems 100 are immersed in a non-conductive fluid with a low boiling point. Novec 649 is an example of a two-phase fluid. Novec 649 is non-conductive and has a boiling point of 49 C. Information handling systems 100 may be immersed in Novec 649 and the Novec 649 may directly remove heat from components 20.

Figure 2:
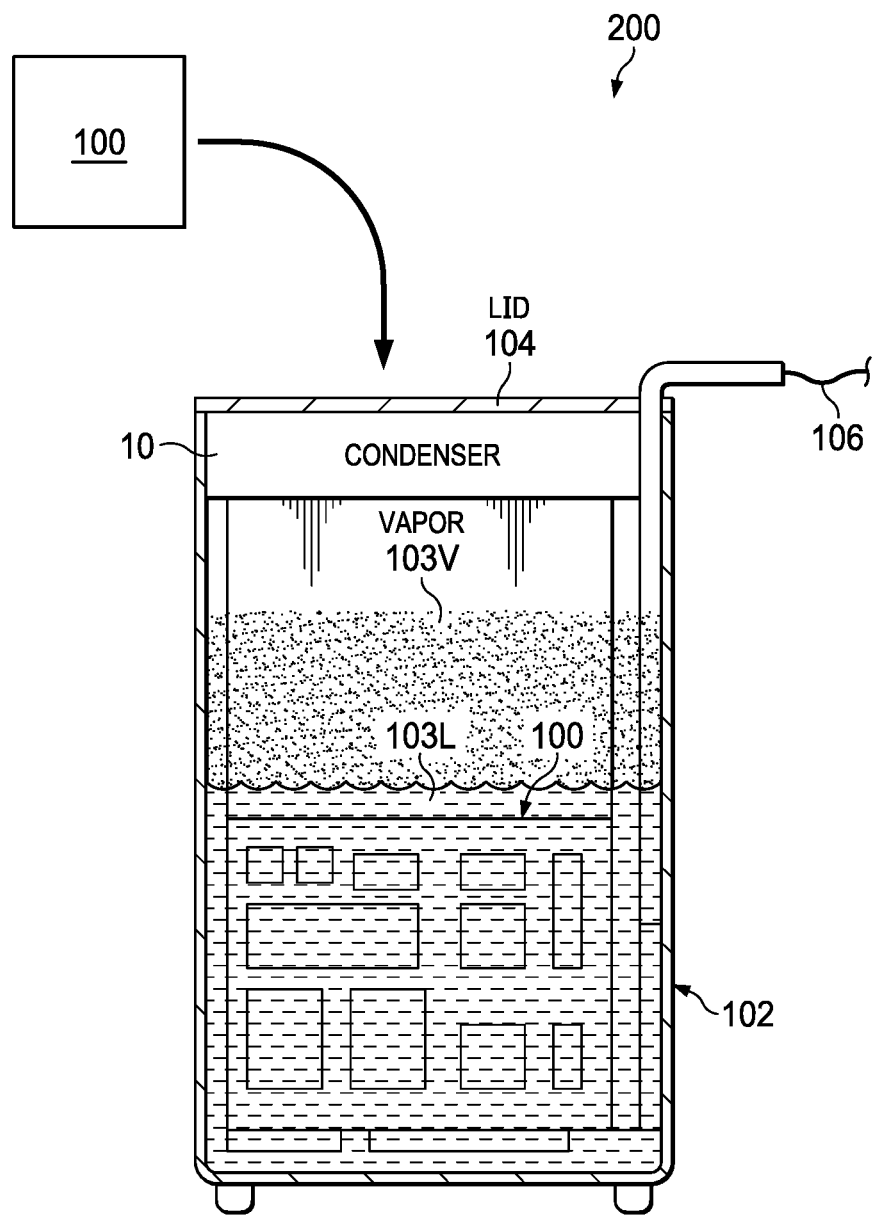
FIG. 2 is a side cutaway view of a two-phase immersion cooling system with the information handling system of FIG. 1 installed therein.

FIG. 2 is side cutaway view of a two-phase immersion cooling system with information handling system 100 installed therein.

As shown in FIG. 2, a two-phase immersion cooling system 200 may include, but is not limited to, tank 102 containing fluid 103 with lid 104, cables 106, heat exchanger 108 and vapor trap 110.

Tank 102 contains two-phase fluid 103 capable of existing in both a liquid phase (denoted as fluid 103L) and as a vapor (denoted as fluid 103V), wherein "fluid 103" comprises a non-conductive fluid with a low boiling point and includes fluid 103L and fluid 103V. Lid 104 allows for installation, removal and servicing of one or more information handling systems 100 in tank 102. When closed, lid 104 seals tank 102 to prevent contaminants from entering fluid 103.

Cables 106 provide power and communication functionality to the components 20 on information handling system 100.

Heat exchanger 108 is configured to remove heat from fluid 103. Contact by fluid 103V with heat exchanger 108 results in condensation, which changes fluid 103V to fluid 103L.

Vapor trap 110 may remove water vapor from tank 102 to prevent contamination of fluid 103.

Components 20 use the power to process instructions and, in the process, generate heat. Using fluid 103 with a low boiling point is effective in removing heat from components 20 and information handling system 100 due to phase transformation of fluid 103 from a liquid phase to a vapor phase and conduction. If components 20 generate enough heat, localized boiling of fluid 103L may occur near a component surface, wherein much of the cooling happens because of the phase transformation. As fluid 103L boils, bubbles of fluid 103V form near component 20 and rise to the surface, which promotes fluid flow past component 20, wherein conduction further cools components 20. Since tank 102 is sealed, fluid 103V may exit fluid 103L but fluid 103V is retained in tank 102. For some heat generating components 20, a component surface may be etched or treated with a boiling enhancement coating (BEC) (not shown) to increase the surface area for increased boiling.

Residues—Overview

Two-phase immersion cooling of components 20 is susceptible to problems if contaminants are present in fluid 103. Contaminants may be introduced into fluid 103 when components 20 or information handling systems 100 are added, serviced or replaced. For example, liquid water can solvate contaminates and become corrosive. Contaminants may collect in certain areas of tank 102 relative to information handling systems 100 due to the two-phase immersion cooling process. For example, when fluid 103V condenses into fluid 103L, fluid 103L in some areas of tank 102 may be highly concentrated or pure, causing plasticizers and other contaminants to leach from printed circuit boards (PCBs), cables, plastic parts and other components of information handling system 100 with negative pressures or diffusion through elastomers. Also, when fluid 103L boils to change into fluid 103V, contaminants in the form of residues are distilled out of fluid 103L at the point where the boiling occurs.

Effects of Residues

Residues caused by distilling contaminants out of fluid 103L may negatively affect heat transfer from components 20. For example, residues may be deposited on a component surface, which can decrease the rate at which heat can be transferred out of the component 20. For components 20 with etched component surfaces or BECs, covering the component surface or filling in the component surface texture with residues will reduce the total surface area of the component surface, further reducing the rate at which heat can be transferred away from component 20. Residues can also lead to corrosion and metal migration, which may result in problems such as fouled contact points and current leakage paths (bridging) or some other interference between components 20. For example, corrosive residues may interact with ball grid arrays (BGAs), providing a catalyst for metal migration. Metal migration may refer to the displacement and movement of metal ions in a conductor, and in particular to the deposition of the metal ions in structures capable of causing bridging. For example, in ball grid arrays (BGAs), contaminants in fluid 103L may corrode a lead solder coating over a copper or silver trace. The corroded metal may migrate to form dendrites or other structures. These structures may provide a bridge or path for current to leak between adjacent traces, contact points, solder balls or other terminals or connections, causing a short relative to components 20. In doing so, current leakage can damage the component 20 up to failure of the component. Furthermore, a negative effect associated with one contaminant may combine with negative effects of other contaminants, leading to a cumulative increase in residue or causing a cascading failure.

Preventing Metal Migration

An approach to preventing metal migration is to use materials that do not leach or otherwise release contaminants into fluid 103. For example, some materials have been identified that are less likely to leach contaminants when in contact with Novec 649. However, not all materials can be replaced. As a result, contaminants are commonly found in fluids 103 when using two-phase immersion cooling.

Another approach to preventing metal migration is to remove contaminants and water from fluid 103. Filters are used in an effort to remove contaminants. Activated carbon filters can remove plasticizers and acidic compounds. However, filters might not remove all contaminants and filter capacity could be exceeded if tank 102 is opened, new information handling systems 100 are added to tank 102, an information handling system 100 is replaced or parts containing plastic are added or replaced. If the filter capacity is exceeded, contaminants are not removed and metal migration may occur anywhere in tank 102. Furthermore, cleaning residue out from underneath BGAs and other components 20 is not always possible such that reversal or remediation of residues is not always possible. As a result, residues present in immersion cooling system risk permanently damaging BGAs and contact points or lead to failures in an entire tank 102 of information handling systems 100. Consequences of metal migration include replacing failed components 20 and information handling systems 100. There may be many components 20 on multiple information handling systems 100 that need to be replaced in a single tank 102.

Embodiments disclosed herein may include a system for early detection of metal migration to allow for corrective actions before permanent damage to information handling systems 100 or components 20 on information handling systems 100 can occur.

Measuring Current Leakage as an Indicator of Metal Migration

To overcome these problems and others, embodiments may include a metal migration monitoring system for detecting metal migration based on current leakage between combs in a comb structure. In some embodiments, current leakage is measured and analyzed. Any current leakage may indicate the onset of metal migration attributed to the presence of contaminants in fluid 103. As current leakage increases, embodiments may determine this as an indicator that metal migration is occurring at a rate sufficient to cause bridging or result in other unwanted effects.

Metal Migration Monitoring Systems—Overview

Referring to one or more of FIGS. 3A-3B and 4-6, embodiments of a metal migration monitoring system may monitor a pair of combs in information handling system 100 to detect current leakage.

Figure 3A:
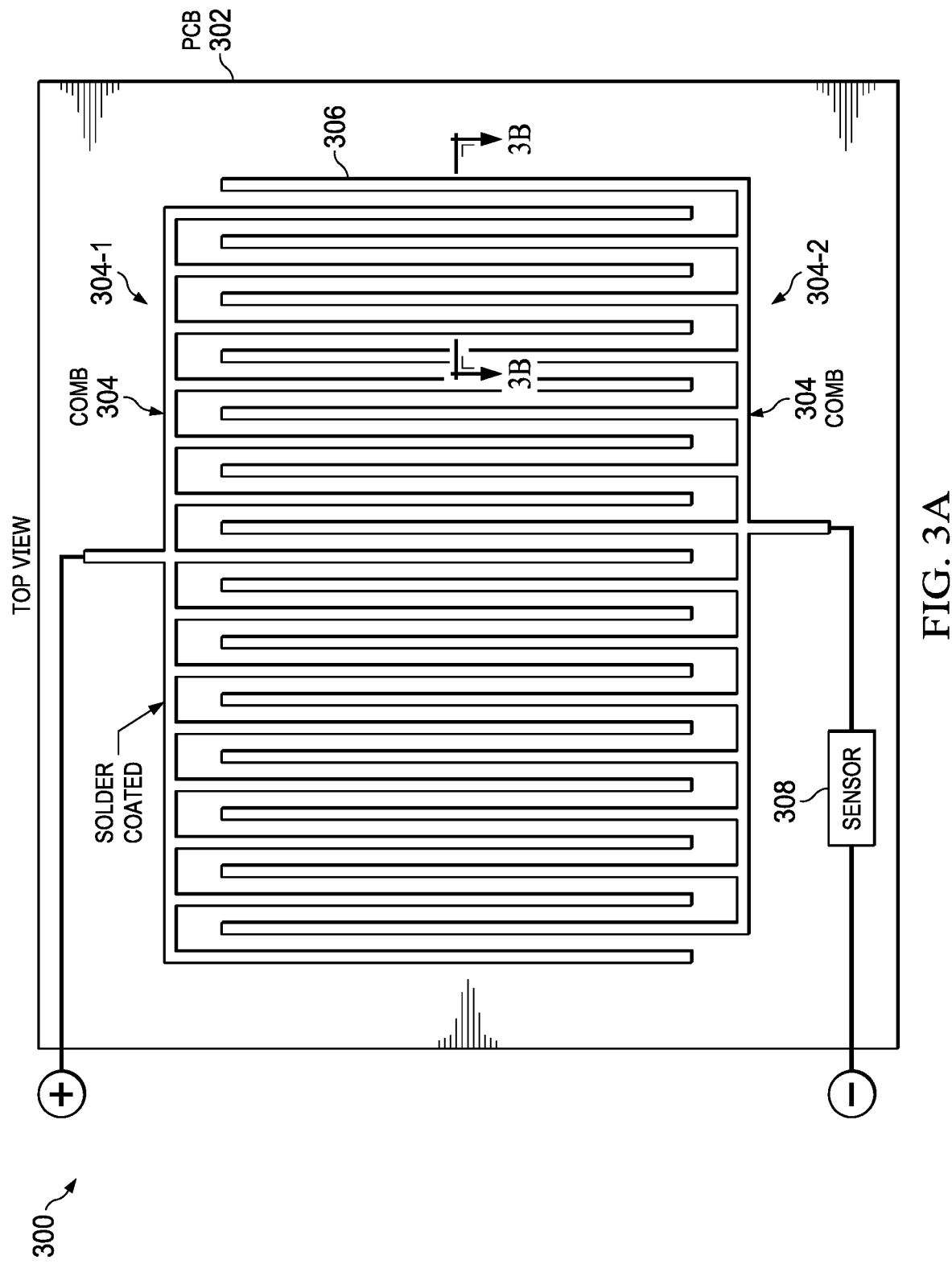
FIGS. 3A-3B are top and side cross-section views, respectively, of one embodiment of a metal migration monitoring system for detecting residue in fluid contained in the two-phase immersion cooling system of FIG. 2.
Figure 3B:
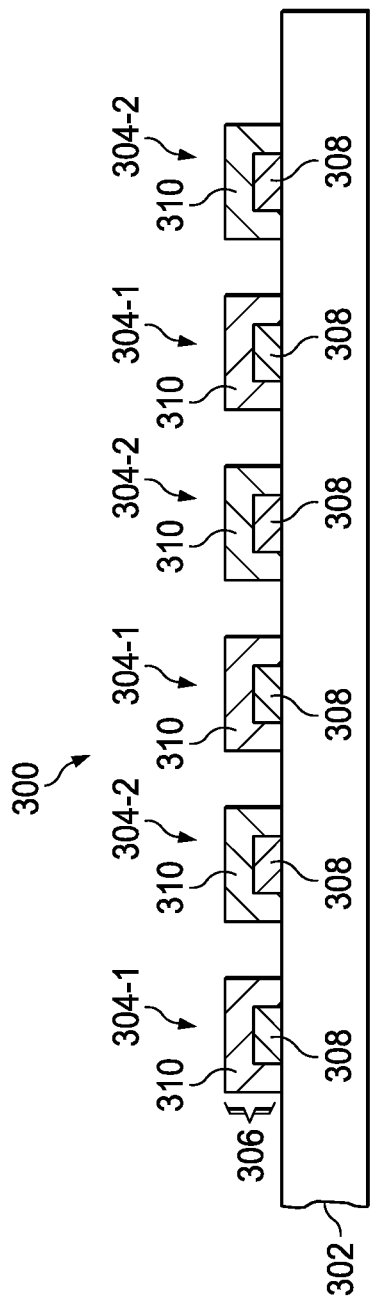

Referring to FIGS. 3A-3B, embodiments of a metal migration monitoring system 300 may comprise a printed circuit board (PCB) 302 with two combs 304 formed thereon, a voltage source (not shown) coupled to a first comb 304-1 and a current sensor 308 coupled to a second comb 304-2 for detecting current and outputting a signal to a processor (not shown) based on the detected current.

Each comb 304 comprises a plurality of fingers 306, wherein the fingers 306 of a first comb 304-1 alternate between the fingers 306 of a second comb 304-2. To increase the sensitivity of metal migration monitoring system 300, each comb 304 may be formed with a plurality of fingers 306 to provide a long edge-edge length (the overlap between a finger 306 from the first comb 304-1 and an adjacent finger 306 from the second comb 304-2) and each finger 306 on each comb 304 may be separated from an adjacent finger 306 on the other comb 304 by a distance less than the spacing between traces, BGA solder balls or other connections. For example, a pair of combs 304 may be configured with each finger 306 having a width substantially equal to a diameter of a solder ball and a length that is many times larger. The diameter of BGA solder balls and the separation distance between BGA solder balls may also vary. A longer edge-edge length for each finger 306 and a decreased separation distance between adjacent fingers 306 increase the sensitivity of metal migration monitoring system 300 to increase the likelihood that metal migration monitoring system 300 can detect metal migration before the metal migration impacts components 20 or information handling system 100.

A pair of combs 304 may be configured to represent a type of connection. Referring to FIG. 3B, fingers 306 may be formed to represent a type of connection in information handling system 100. For example, fingers 306 may be formed with a copper trace 308 and a solder coating 310 to represent materials found in BGA solder balls or other solder terminations and the separation distance between a finger 306 in first comb 304-1 and a finger 306 in the second comb 304-2 is less than the separation distance between two BGA solder balls forming the connection. As solder coatings 310 corrode, metal migration occurs in combs 304-1 and 304-2 such that current leakage between adjacent fingers 306 of combs 304-1 and 304-2 will occur. The material composition and dimensions of each finger 306, the voltage applied to a first comb 304-1, and the separation distance between adjacent fingers 306 on combs 304-1 and 304-2 ensure metal migration occurs between combs 304-1 and 304-2 and is detectable before it occurs at BGAs and other connections in information handling system 100.

In some embodiments, metal migration monitoring system 300 may comprise multiple pairs of combs 304, with each pair of combs 304 is configured to represent one type of connection present between a component 20 and information handling system 100.

In operation, voltage source 305 applies a voltage to first comb 304-1. Ideally, a voltage applied to first comb 304-1 will not affect second comb 304-2. However, metal migration may occur if contaminants are present, and current leakage detected by current sensor 308 may indicate metal migration is occurring in either comb 304. Current sensor 308 may be configured to detect current leaking from first comb 304-1 to second comb 304-2 and output a signal. The signal may be a basic signal such that current sensor 308 sends the signal if any current is detected, or the signal may include information such as a current level, whether the current is constant or intermittent, or some other characteristic of the current. In some embodiments, current sensor 308 may send the signal to a processor 20-1 on an information handling system 100 immersed in a cooling system in tank 102. In some embodiments, current sensor 308 may send the signal to an information handling system outside of tank 102, such as a service system communicatively coupled to information handling system 100 or metal migration system 300.

Metal Migration Monitoring Systems—Stand Alone

Figure 4:
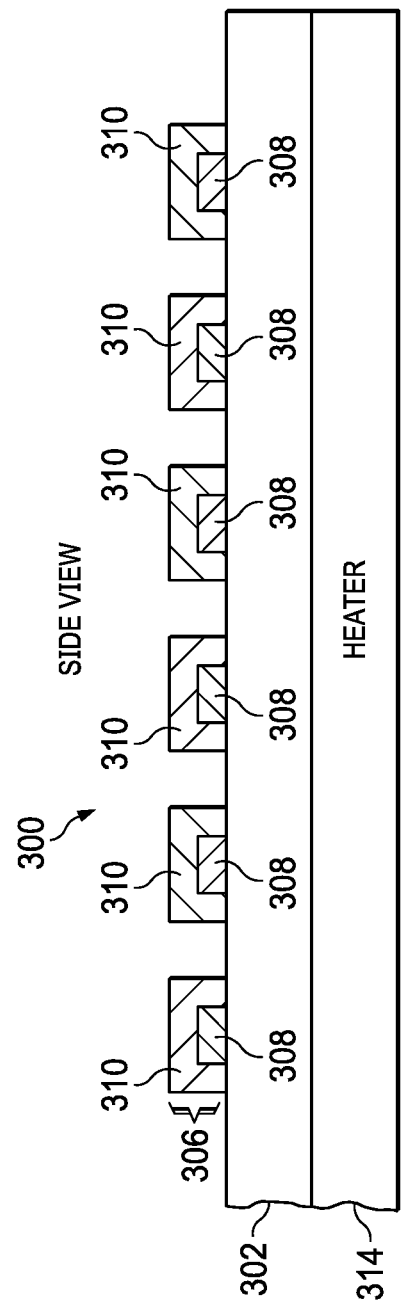
FIG. 4 is a side cross-section view of one embodiments of a stand-alone metal migration monitoring system for use in a two-phase immersion cooling system.

Referring to FIGS. 3A-3B and 4, PCB 302 may be a stand-alone PCB 302 to allow remotely installing metal migration monitoring system 300 away from other components 20 or installing in an area of tank 102 where contaminants are more likely to be distilled out of fluid 103. In some embodiments, metal migration monitoring system 300 may be positioned in an area of tank 102 in which fluid 103L is known to boil or contaminants are likely to be deposited on combs 304. For example, positioning metal migration monitoring system 300 near condenser 108 may expose fingers 306 to higher concentrations of fluid 103L such that solder coatings 310 are more susceptible to metal migration.

Positioning metal migration system 300 away from components 20 may minimize the possibility that metal migration monitoring system 300 contributes to an increase in contaminants near components 20. Referring to FIG. 4, to increase the likelihood that metal migration monitoring system 300 can detect metal migration, embodiments may include heat source 314 coupled to PCB 302. Heat source 314 may be configured to generate heat to ensure boiling occurs near fingers 306 to increase the likelihood that conditions for metal migration are present between fingers 306. Heat source 314 may be configured to generate more heat than any heat generating component 20 to maximize the rate at which fluid 103 boils in the vicinity of metal migration monitoring system 300.

Metal migration monitoring system 300 may be configured with combs 304 positioned on a first side of PCB 302 and heat source 314 positioned on an opposite side of PCB 302. Heat source 314 may be configured to heat two-phase fluid 103 to a temperature to cause boiling for distilling contaminants out of two-phase fluid 103L near fingers 306. In some embodiments, heat source 314 may be configured to generate more heat than any component 20 on PCB 302 or on information handling system 100. In some embodiments, heat source 314 may be configured to generate more heat in the vicinity of combs 304 such that contaminants have a higher probability of being deposited on combs 304 than any component 20.

Positioning metal migration system 300 away from components 20 may require heat source 314 to generate more heat to boil fluid 103L but minimize the possibility that metal migration monitoring system 300 contributes to an increase in contaminants near components 20.

Metal Migration Monitoring Systems—Integrated

In some immersion cooling systems, stand-alone metal migration monitoring system 300 may be undesirable or impractical. For example, heat source 314 requires power to boil two-phase fluid 103 in tank 102, which could put additional working requirements on heat exchanger 106 or put additional stress on two-phase fluid 103. Also, tank 102 may have limited volume for implementing a stand-alone metal migration system 300 due to multiple information handling systems 100 in tank 102. To avoid these possible obstacles, some embodiments of a metal migration monitoring system 300 may be integrated with information handling system 100 or a component 20 on information handling system 100.

Figure 5:
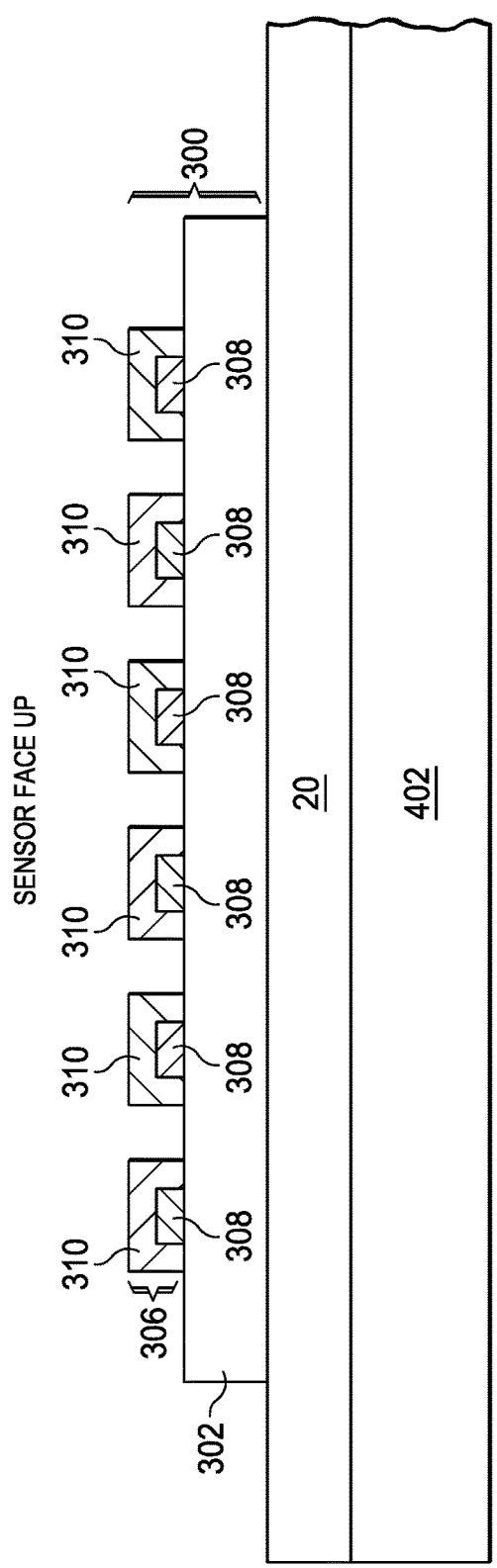
FIGS. 5-6 are side cross-section views of embodiments of metal migration monitoring systems integrated with components in a two-phase immersion cooling system.
Figure 6:
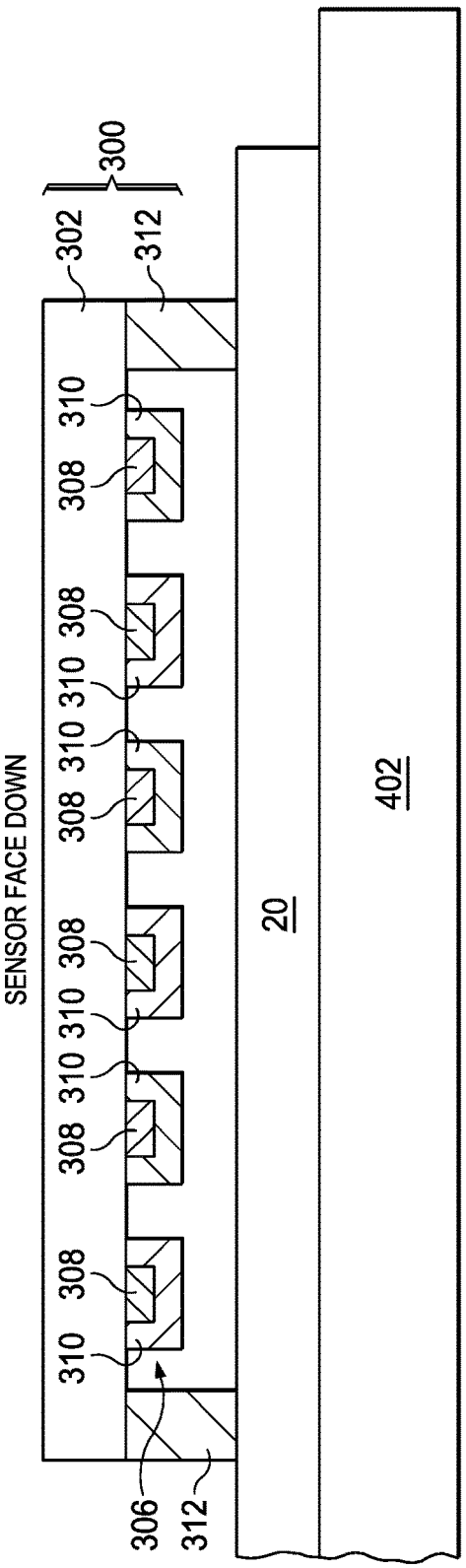

Referring to FIGS. 5 and 6, in some embodiments, metal migration monitoring system 300 may be configured for positioning relative to component 20, wherein component 20 generates heat and functions as heat source 314.

As depicted in FIG. 5, metal migration monitoring system 300 may be configured with PCB 302 positioned against component 20 and combs 304 facing away from component 20. Component 20 may generate heat to cause boiling of two-phase fluid 103L and metal migration monitoring system 300 positioned against component 20 with combs 304 facing away from component 20 may increase the likelihood that contaminants are deposited on fingers 306. In some embodiments, component 20 may be a CPU, GPU or other processor component 20-1 that generates heat during operation of information handling system 100.

Referring to FIG. 6, embodiments may be configured to represent structures or components in information handling system 100. As depicted in FIG. 6, metal migration monitoring system 300 may be configured to represent a BGA with spacers 312 for positioning PCB 302 a distance from component 20. PCB 302 may be coupled to spacers 312 a distance from component 20 with combs 304 facing component 20 such that fingers 306 are positioned between component 20 and PCB 302. Component 20 functioning as heat source 314 may cause boiling of two-phase fluid 103L between component 20 and PCB 302. Configuring metal migration monitoring system 300 with fingers 306 in the space between PCB 302 and component 20 may increase the likelihood that contaminants are distilled from two-phase fluid 103 near fingers 306. Positioning PCB 302 a distance away from component 20 reduces the possibility for metal migration monitoring system 300 to negatively affect processing by component 20.

The configuration of an integrated metal migration monitoring system 300 may be based on, for example, the location of information handling system 100 in tank 102, the location of metal migration monitoring system 300 on information handling system 100 or the location of metal migration monitoring system 300 relative to a component 20. For example, integrating metal migration monitoring system 300 with a PCIe card (not shown) or a graphics processing unit (GPU) or other high heat generating component 20 utilize nearby components 20 as a heat source instead of utilizing a separate dedicated heat source 314 but increase the likelihood that residues being distilled out of fluid 103 can be detected by metal migration monitoring system 300.

In response to determining a residue or other contaminant is present in fluid 103, embodiments of contact resistance monitoring systems may communicate a signal to allow for corrective measures before the level of residue or corrosion damages a component 20 on information handling system 100 or interferes with operation of a component 20. Some embodiments may be configured to communicate a basic signal that indicates residue or corrosion is present. Some embodiments may be configured to communicate a signal that indicates a filter must be changed, that fluid 103 should be replaced, that a component 20 or information handling system 100 should be replaced or will need to be replaced soon, or some other corrective measure less than a total replacement of all information handling systems 100 in tank 102. A signal may include one or more measurements to allow a processor 20-1 to determine an amount of residue present in tank 102.

In some embodiments, metal migration monitoring system 300 may be integrated with a processor component 20-1 and the component 20-1 may execute instructions to determine if metal migration is present or starting. In some embodiments (not shown), metal migration monitoring system 300 may integrate components 20 and operate as a system on a chip (SoC). A SoC may include a central processing unit (CPU) component 20-1, memory components 20-2, input/output ports 20-3 and other components 20 on a single substrate or microchip. A SoC may perform signal processing functions and may reduce power consumption needed to process instructions for detecting current leakage or otherwise detecting the presence of residues in information handling systems 100.

In response to determining metal migration is occurring, embodiments of metal migration monitoring systems 300 may communicate a signal to a service system to allow for corrective measures before the metal migration damages or interferes with operation of a component 20. In some embodiments, metal migration monitoring system 300 may be configured to communicate a basic signal to an information handling system as part of a service system exterior to tank 102. Some embodiments may be configured to communicate a basic signal to the service system that current leakage is occurring. Some embodiments may be configured to communicate a signal to the service system that indicates a filter in tank 102 must be changed, that fluid 103 should be replaced, that a component 20 or information handling system 100 should be replaced or will need to be replaced soon, or some other corrective measure less than a total replacement of all information handling systems 100 in tank 102. A signal may include one or more measurements to allow an information handling system or technician to determine the extent that metal migration is occurring in tank 102. A signal may include an indication to information handling system 100 to prevent processing by information handling system 100 or one or more components 20 on PCB 302 to prevent a short circuit from damaging components 20 or information handling system 100.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A system for detecting metal migration in an information handling system immersed in a two-phase fluid in a tank, the system comprising:
    a printed circuit board (PCB) comprising:
        a first comb having a first plurality of fingers;
        a second comb having a second plurality of fingers, wherein each finger of the first plurality of fingers is positioned between two adjacent fingers of the second plurality of fingers;
    a voltage source connected to the first comb; and
    a current sensor coupled to the second comb, the current sensor configured to detect current leakage from the first comb to the second comb and output a signal based on the current leakage; and
    a processor coupled to the current sensor and configured to:
        receive the signal from the current sensor;
        determine the current leakage based on the signal; and
        communicate an indication that contaminants are present in the two-phase fluid based on the current leakage.

2. The system of claim 1, wherein each finger in the first plurality of fingers and the second plurality of fingers comprises:
    a trace formed from a first material; and
    a solder coating formed from a second material.

3. The system of claim 2, wherein the trace comprises copper and the solder coating comprises an alloy with tin, lead and silver.

4. The system of claim 1, wherein the first plurality of fingers in the first comb and the second plurality of fingers in the second comb are configured to represent a type of connection corresponding to a component in the information handling system.

5. The system of claim 4, wherein each finger in the first plurality of fingers is configured with a width to corresponding to a diameter of a solder ball in a ball grid array (BGA) and each finger in the first plurality of fingers is separated from a finger in the second plurality of fingers by a distance less than a separation distance between two solder balls in the BGA.

6. The system of claim 1, wherein the system is positioned near a component, wherein the component functions as a heat source to cause boiling of the fluid.

7. The system of claim 6, wherein the pair of combs are positioned facing away from the component.

8. The system of claim 6, comprising a spacer between the component and the current sensor, wherein the pair of combs is positioned at a distance from the component by the spacer and the pair of combs are facing away from the component.

9. The system of claim 6, comprising a spacer between the component and the current sensor, wherein the pair of combs are positioned at a distance from the component by the spacer and the pair of combs are facing toward the component.

10. The system of claim 1, further comprising a heat source coupled to the PCB, wherein the heat source is configured to cause boiling of the fluid away from a component.

11. The system of claim 10, wherein the heat source is configured to generate more heat than the component.

12. The system of claim 1, wherein the information handling system is communicatively coupled to a service system external to the tank.

13. A method for detecting metal migration in an information handling system immersed in a two-phase fluid in a tank, the method comprising:
    applying a voltage to a first comb of a pair of combs on a printed circuit board (PCB) immersed in a two-phase fluid in a tank, wherein the first comb comprises a first plurality of fingers and a second comb comprises a second plurality of fingers and each finger of the first plurality of fingers is positioned between two fingers of the second plurality of fingers;
    detecting, in a second comb on the PCB, a current leakage from the first comb to the second comb;
    determining metal migration is present based on the current leakage detected in the second comb; and
    sending a signal that contaminants are present in the two-phase fluid based on the current leakage.

14. The method of claim 13, wherein the first plurality of fingers in the first comb and the second plurality of fingers in the second comb are configured to represent a type of connection corresponding to a component in the information handling system.

15. The method of claim 13, further comprising positioning the pair of combs near a component, wherein the component functions as a heat source to cause boiling of the two-phase fluid.

16. The method of claim 15, further comprising positioning the pair of combs facing away from the component.

17. The method of claim 16, further comprising positioning a spacer between the component and the current sensor, wherein the pair of combs is positioned at a distance from the component by the spacer and the pair of combs are facing away from the component.

18. The method of claim 15, further comprising positioning a spacer between the component and the current sensor, wherein the pair of combs is positioned at a distance from the component by the spacer and the pair of combs are facing toward the component.

19. The method of claim 13, further comprising coupling a heat source to the PCB, wherein the heat source is configured to cause boiling of the fluid away from a component.

20. The method of claim 13, wherein sending a signal that contaminants are present in the two-phase fluid based on the current leakage comprises sending a signal to a service system external to the tank.

\* \* \* \* \*